United States Patent [19]

Ichijo

[11] 4,238,726

[45] Dec. 9, 1980

[54] METHOD OF MEASURING LOW IMPEDANCE FOR OBTAINING UNKNOWN CAPACITANCE AND/OR RESISTANCE

[76] Inventor: Bunjiro Ichijo, 23-10, Hirosawa 2-chome, Hamamatsu-shi, Shizuoka-ken, Japan

[21] Appl. No.: 8,971

[22] Filed: Feb. 2, 1979

[30] Foreign Application Priority Data

Feb. 13, 1978 [JP] Japan .................................. 53-15115

[51] Int. Cl.$^3$ .................... G01R 27/00; G01R 27/02; G01R 27/26
[52] U.S. Cl. .............................. 324/57 R; 324/57 Q; 324/60 C; 324/61 QL; 324/62
[58] Field of Search .............. 324/60 C, 60 R, 61 QL, 324/62, 65 R, 57 R, 57 Q

[56] References Cited

PUBLICATIONS

Ichijo et al.; "A New Method . . . "; IEEE Trans. on Instruments and Measurement; vol. IM-19; No. 1; Feb. 1970; pp. 73-77.
Ichijo et al.; "A Differential Capacitor Circuit . . . "; IEEE Trans. on Instruments and Measurement; vol. IM-22; No. 4; Dec. 1973; pp. 315-319.

*Primary Examiner*—Ernest F. Karlsen
*Attorney, Agent, or Firm*—Spencer & Kaye

[57] ABSTRACT

A method for accurately measuring the capacitances and loss resistances of specimens of an unknown impedance (hereinafter referred to as the "specimen"). The measured values of the capacitances are unaffected by the resistances of the specimens when the equivalent parallel resistances of the specimens vary from infinity to 30 ohms. Several meters' length of HF coaxial cable can be used in place of a lead-wire connecting the measuring part and electrodes.

5 Claims, 26 Drawing Figures

FIG. 2A
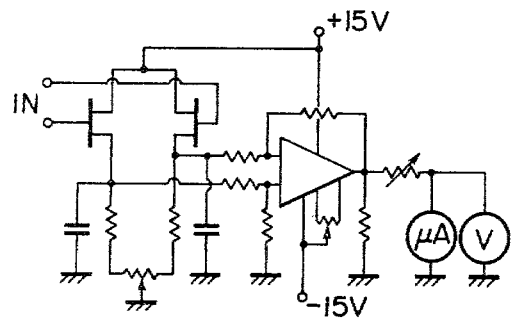
FIG. 2B
FIG. 2C
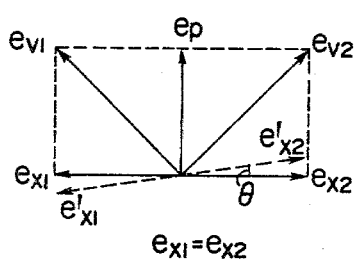
FIG. 2D
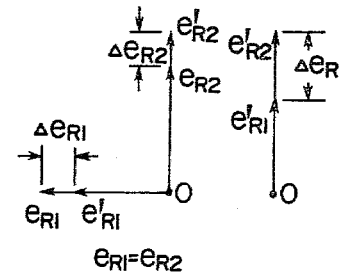
FIG. 4A 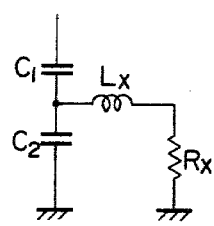 FIG. 4B 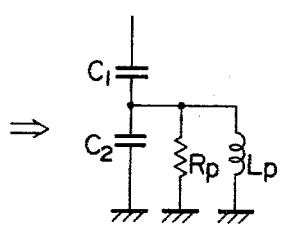 FIG. 4C 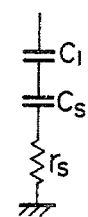
FIG. 5A FIG. 5B FIG. 5C FIG. 5D
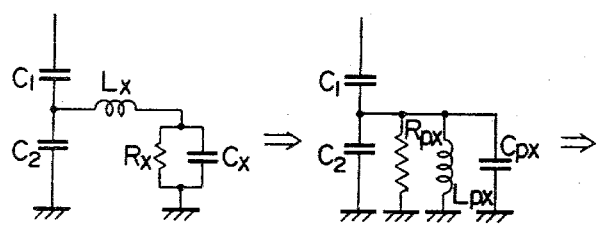

METHOD OF MEASURING LOW IMPEDANCE FOR OBTAINING UNKNOWN CAPACITANCE AND/OR RESISTANCE

This invention relates to a method of accurately measuring capacitances and loss resistances of specimens.

Recently, the demand for accurate measurement of $\epsilon x$ (dielectric constant) and $Ox$ ($1/\tan\delta$) of very high loss materials has been increasing in various fields, such as the medical, agricultural and industrial fields. It is required that the measured capacitance reading not be affected by fluctuation of the resistance components of the specimens because of the various kinds of impurities found in the specimens. The inventor of this invention, et al. made a report in February 1970 on "A new method of measuring dielectric property of very high loss materials at high frequency" in the IEEE Trans., Vol. 1 M-19, pp. 73-77. The mesuring instruments described in this publication are not able to cancel the influence of the specimen's resistance caused by the decrease of resistance due to the small inductance connecting the measuring instrument and the detecting electrode.

One of the objects of this invention is to provide an impedance measuring method which is able to cancel any influence of the specimen's resistance.

According to this invention, measurement of a low impedance for obtaining an unknown capacitance and/or resistance is made by forming a low impedance measuring circuit with (a) a resonant circuit including capacitances $C_1$ and $C_2$ connected in series with each other, (b) a high frequency source to supply the resonant circuit with a high frequency voltage, (c) an amplitude detecting circuit respectively coupled electromagnetically with the high frequency source and the resonant circuit for measuring the resonant current of the resonant circuit, (d) a phase detecting circuit respectively coupled electromagnetically with the high frequency source and the resonant circuit for measuring the phase of the resonant current of the resonant circuit, and (e) means for connecting the connecting point between the capacitances $C_2$ and $C_1$ of the resonant circuit with electrodes to be connected with the impedance to be measured so as to connect the impedance to be measured with the condenser $C_2$ in parallel;

adjusting the resonant circuit to the resonant condition before connecting the impedance to be measured;

connecting then the impedance to be measured and adjusting the capacitance $C_2$ of the resonant circuit to form again the resonant condition;

obtaining the unknown capacitance of the impedance to be measured from the extent of the adjustment of the capacitance $C_2$ and the unknown resistance from the indication of the amplitude detector;

forming the means for connecting with an inductance $Lx$ so as to satisfy the equation $\omega^2 C_2 Lx = 1$ where $\omega$ is the angular frequency of the high frequency source.

This measuring method with simple circuits can make precise measurement of capacitance $C_x$ and loss resistance $R_x$ is very high loss materials with $Q_x$ ranging to as low as about $5\times 10^{-3}$. Therefore, this method may find a wide range of applications in industrial, agricultural, medical and physical property fields, and at present good results are steadily being obtained.

The above and other objects and advantages of this invention will be made apparent by the following description with reference to the attached drawings, wherein:

FIG. 2(A) is a circuit diagram of a detecting circuit used in the embodiments of the method of this invention;

FIG. 2(B) is an equivalent circuit which represents a high frequency source and a parallel resonant circuit;

FIG. 2(C) is a vector diagram of the input voltage of the phase detecting circuit;

FIG. 2(D) is a vector diagram of the input voltage of the amplitude detector;

FIG. 4(A) is a connecting diagram of capacitances $C_1$, $C_2$, the lead-wire $Lx$ and a resistance $Rx$.

FIG. 4(B) shows a converted circuit of FIG. 4(A), and FIG. 4(C) is a further converted circuit of FIG. 4(B);

FIG. 5(A) is a connecting diagram of the capacitances $C_1$, $C_2$, the lead-wire $L_x$, the resistance $R_x$ and a capacitance $C_x$;

Figures 6, 7:
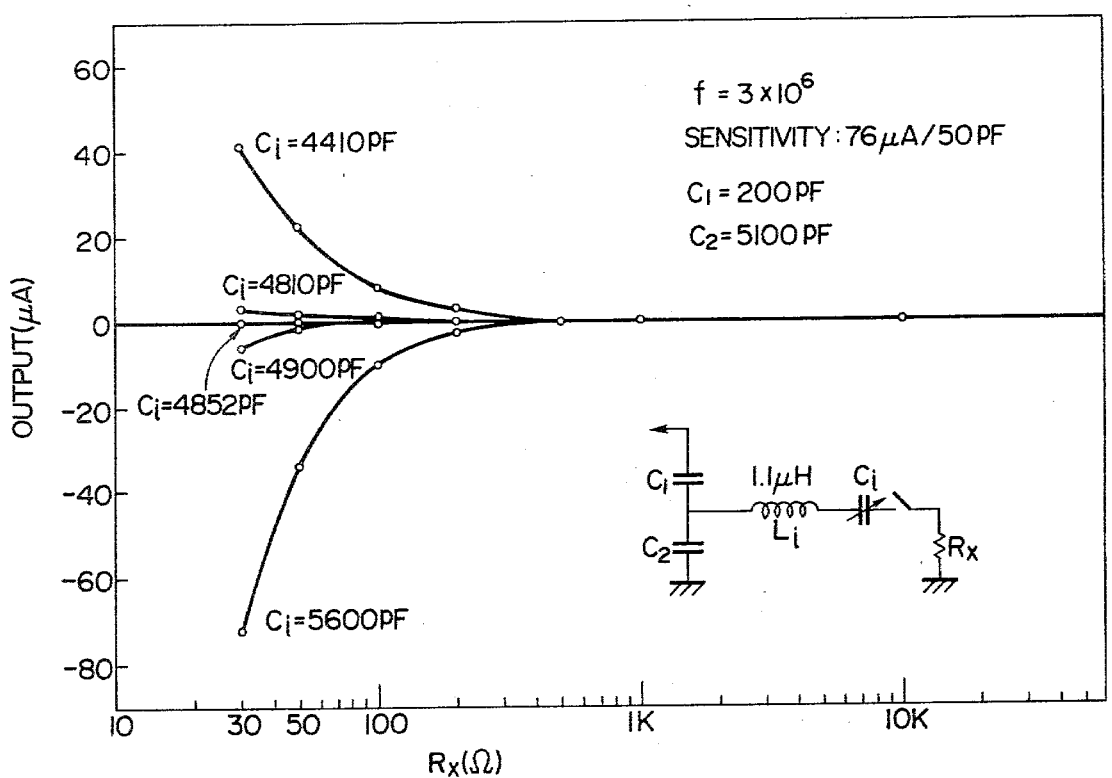

FIG. 5(B) and FIG. 5(C) show a converted circuit of FIG. 5(A), and a further converted circuit of FIG. 5(B), respectively;

FIG. 5(D) is a circuit diagram where the inductance $L_x$ used in FIG. 5(A) is replaced with $Li - (1/\omega^2 Ci)$;

FIG. 6 is a table showing the result of experiments which deals with the adjustment of $L_x$.

Figure 8:
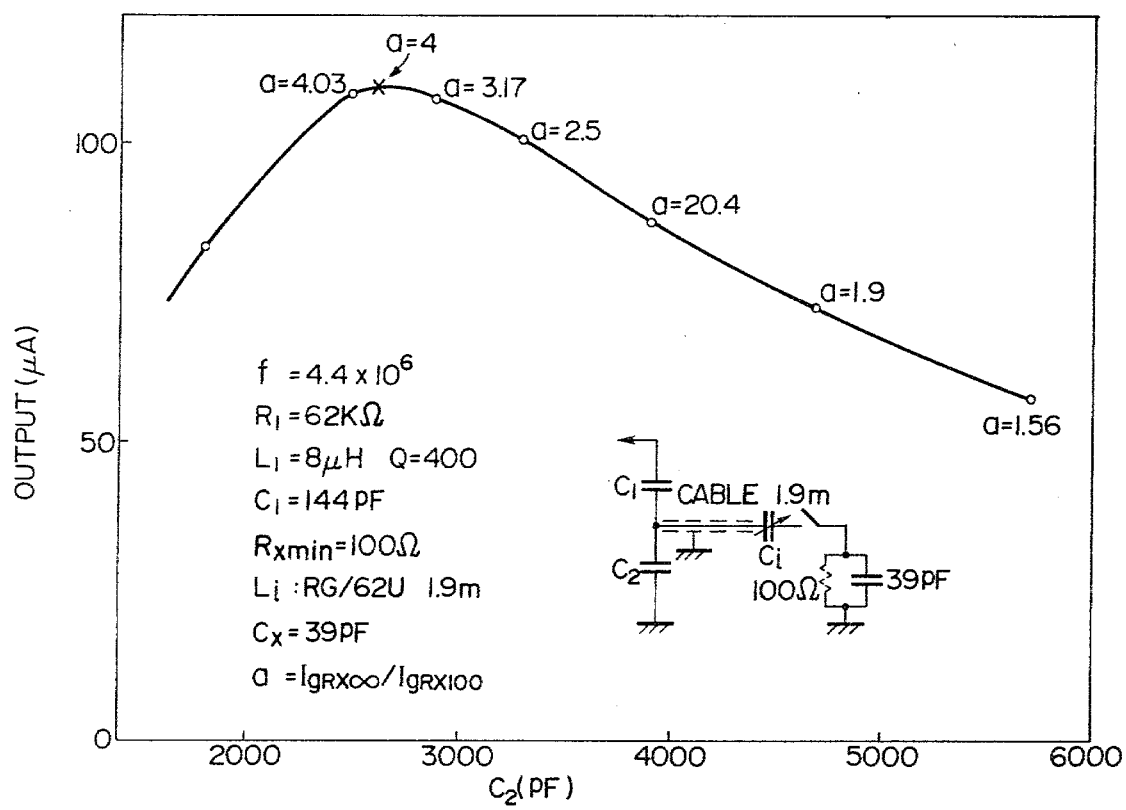
Figure 9:
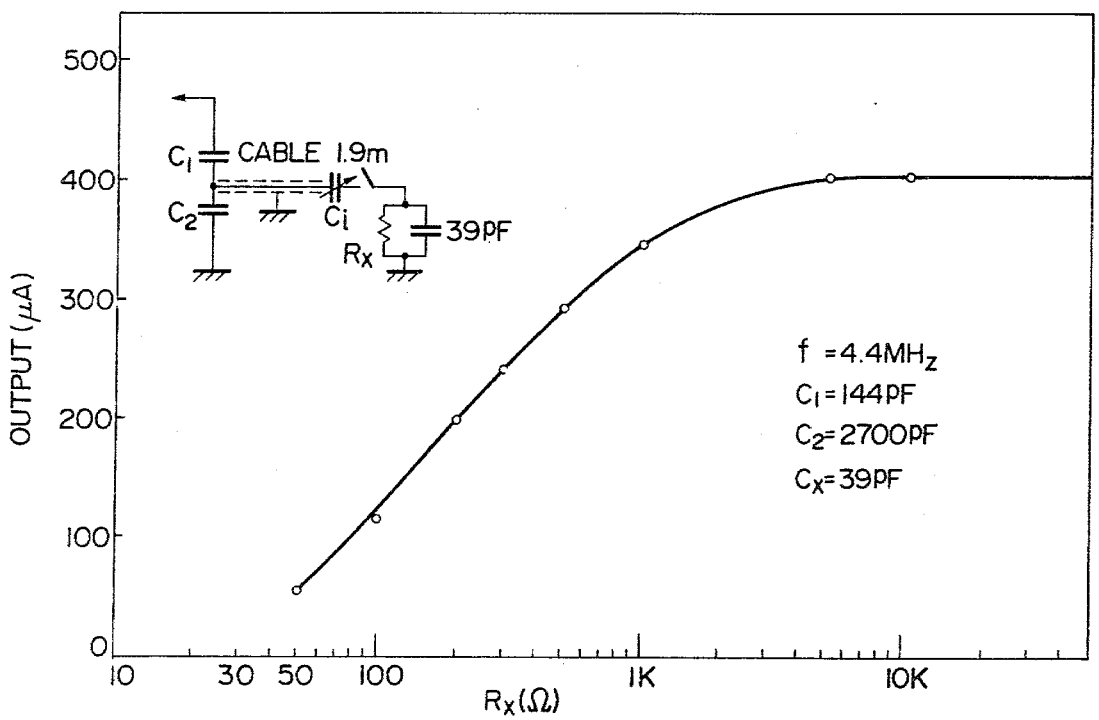
Figure 10:
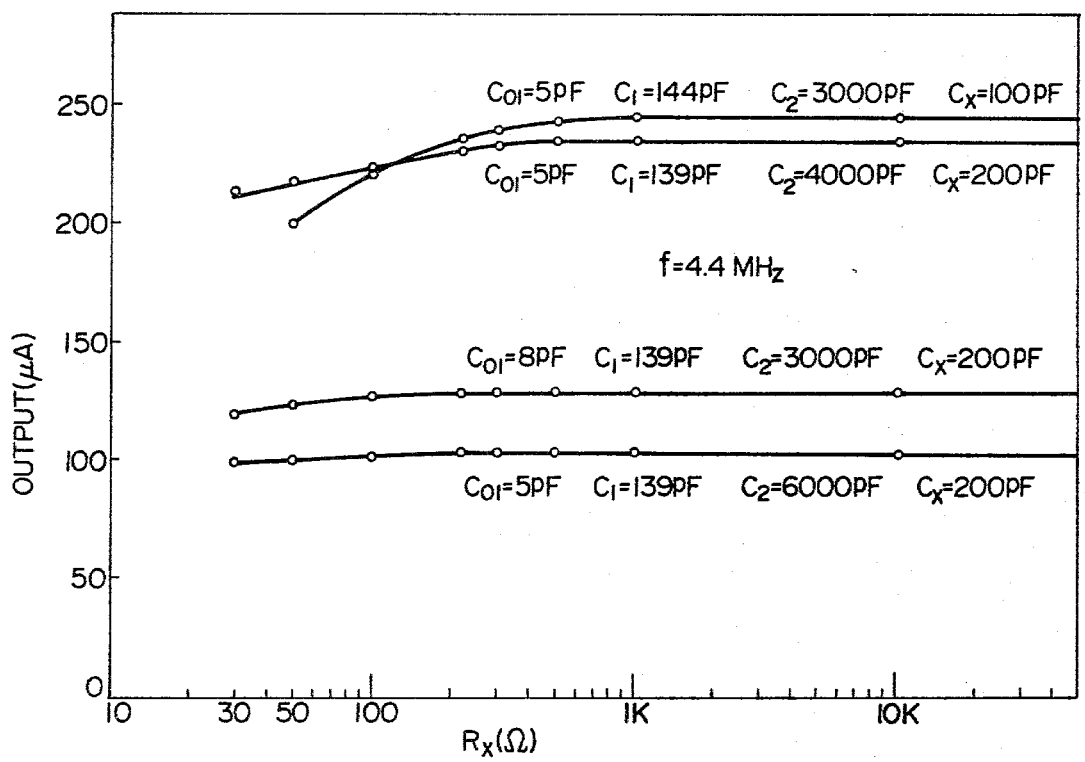
Figure 12:
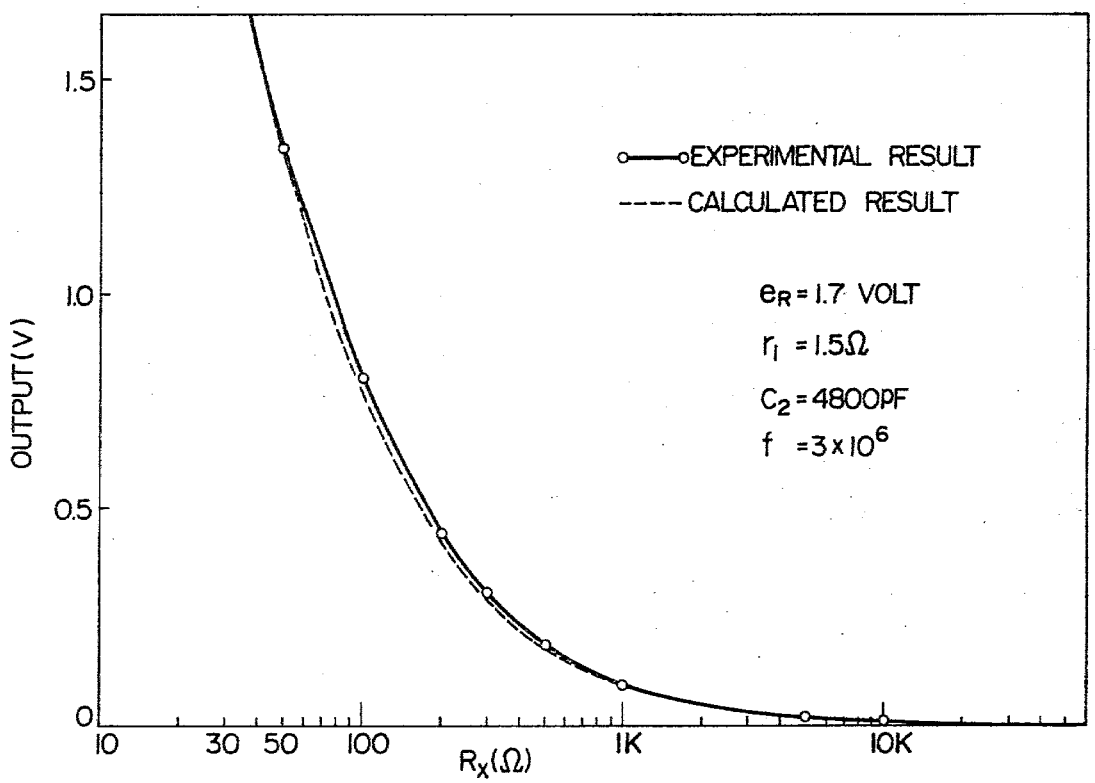
Figure 14:
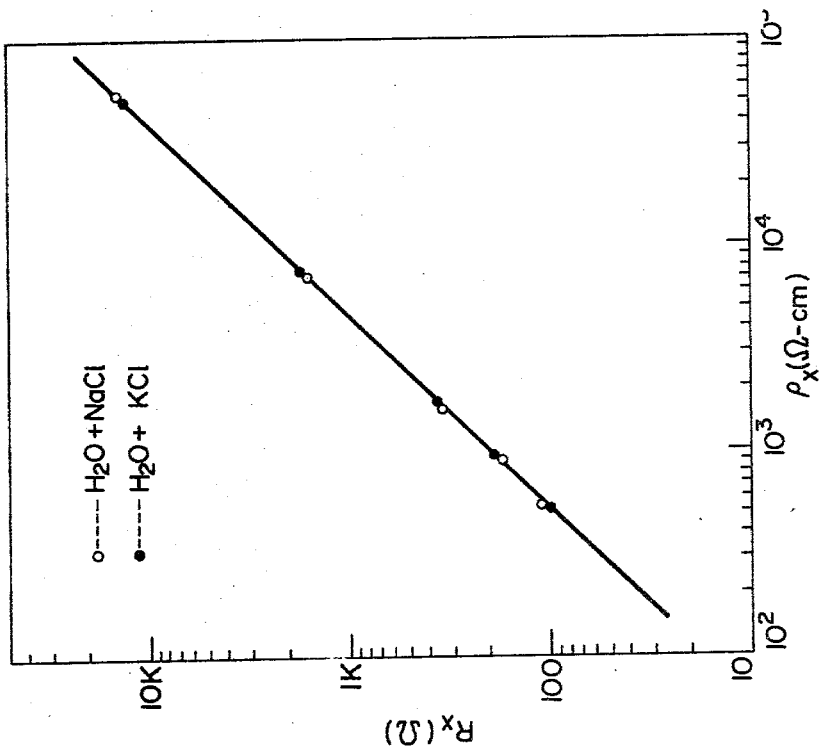
Figure 11:
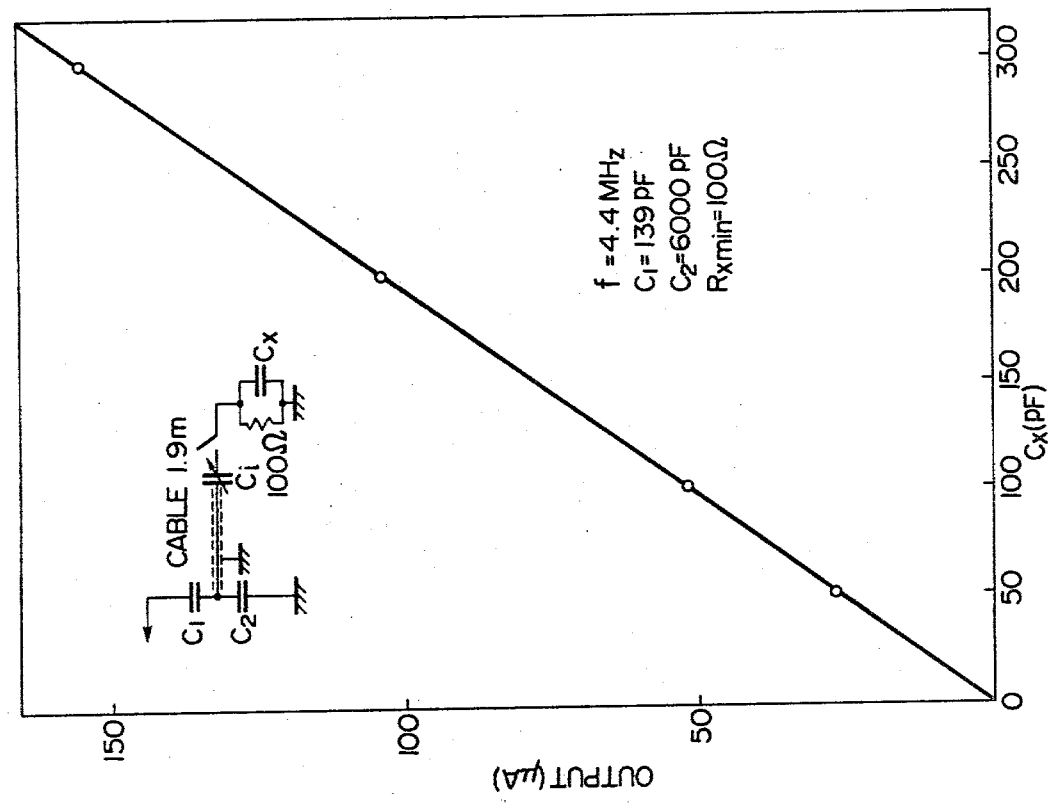
Figure 13:
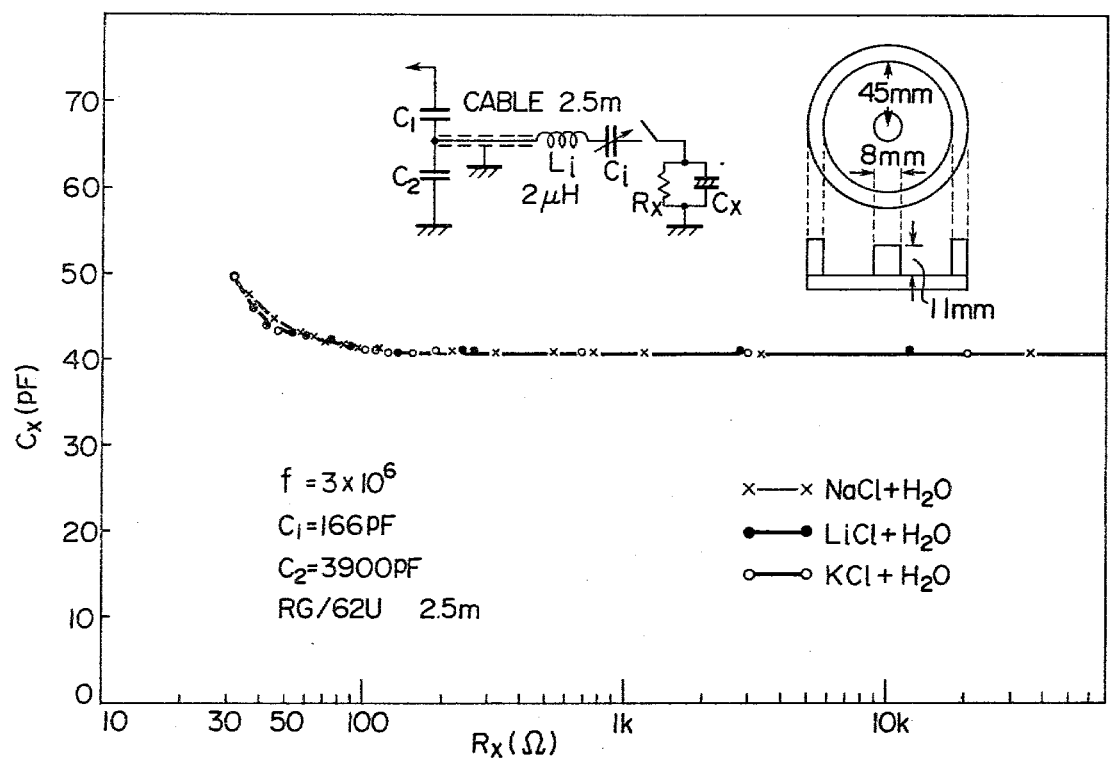
Figure 17:
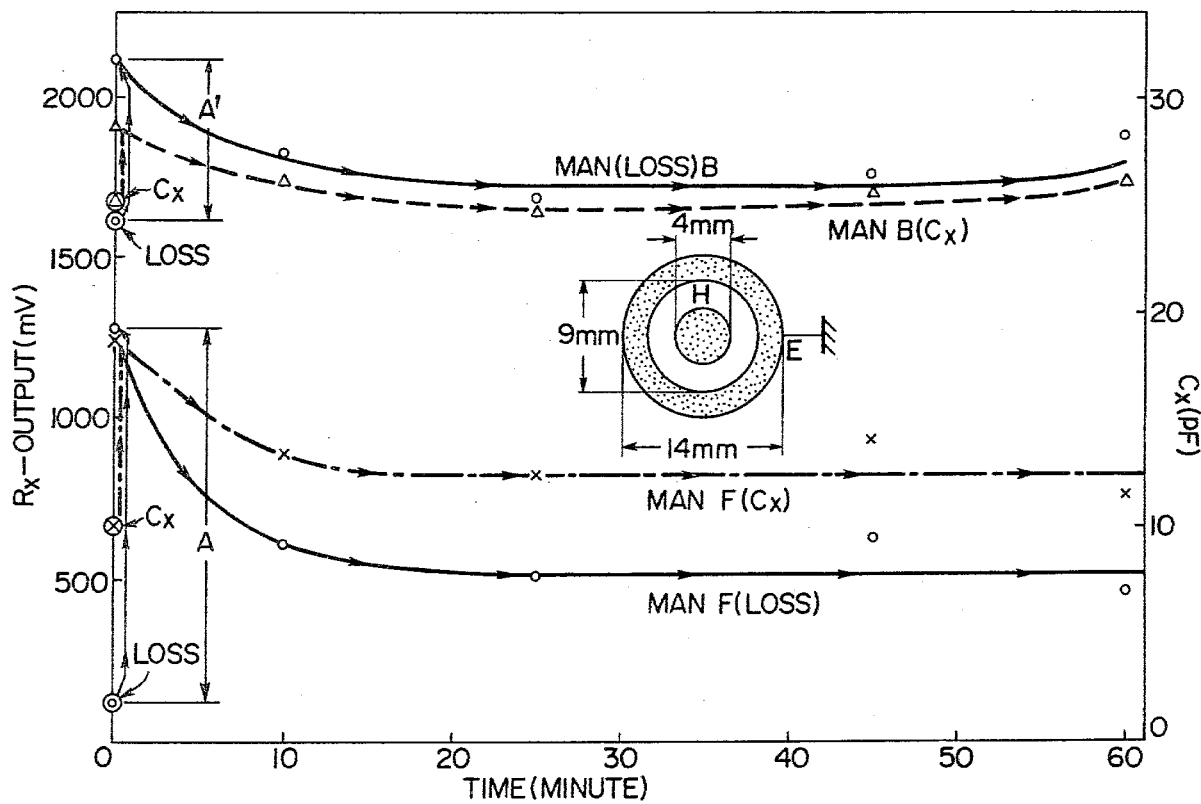
Figure 16:
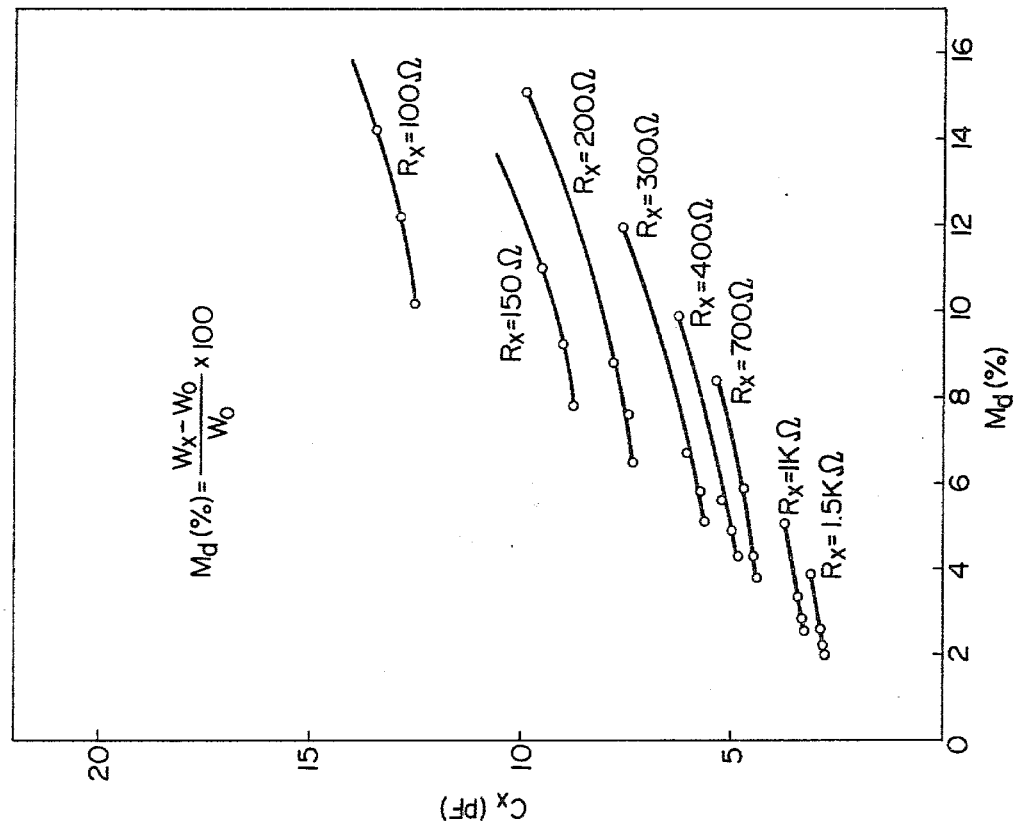
Figure 15:
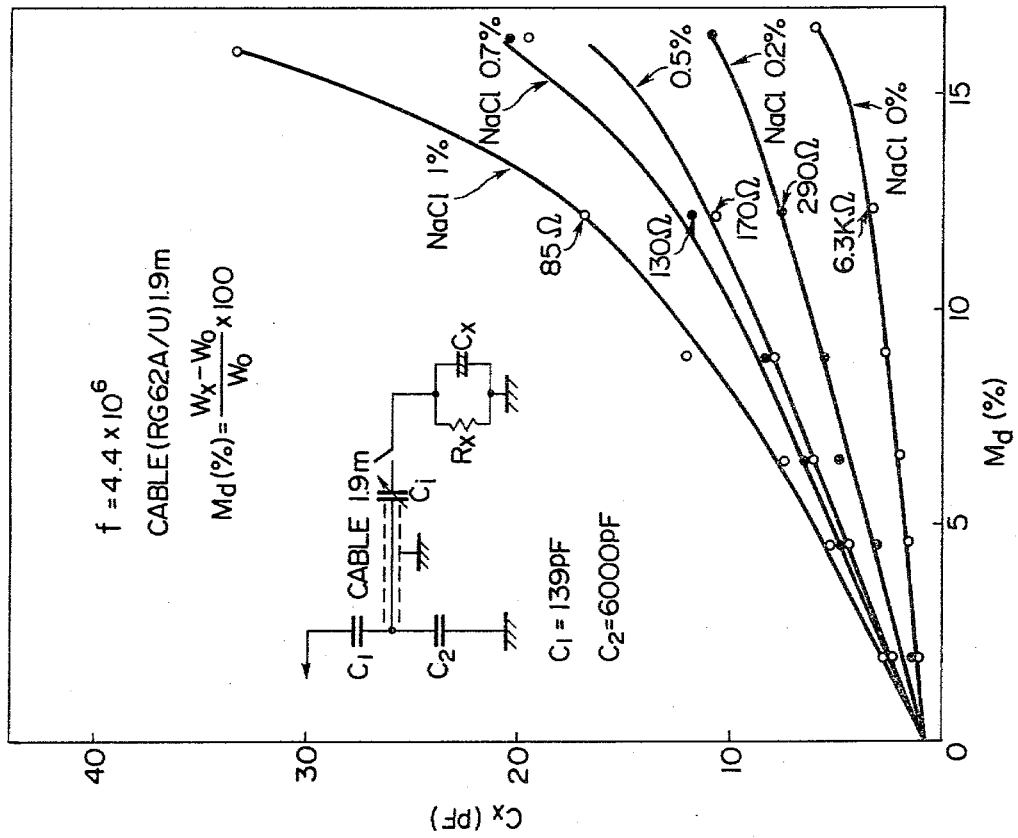

FIG. 7 is a graph showing the relation between an output of the phase sensitive detector and $R_x$, with $C_i$ being taken as a parameter;

FIG. 8 is a graph showing the relation between the output of the phase sensitive detector and $C_2$;

FIG. 9 is a graph showing the relation between the output of the phase sensitive detector and $R_x$ as a zero method capacitance meter;

FIG. 10 is a graph showing the relation between the output of the phase sensitive detector and $R_x$, with $C_{01}$ and $C_2$ being taken as parameters;

FIG. 11 is a graph showing the relation between the output of the phase sensitive detector and $C_x$;

FIG. 12 is a graph showing the relation between the output of an amplitude sensitive detector and $R_x$;

FIG. 13 is a graph showing the relation between $C_x$ and $R_x$ of electrolytic solution by a concentrical-cylindrical electrode;

FIG. 14 is a graph showing the relation between $p_x$ and $R_x$ of the electrolytic solution;

FIG. 15 is a graph showing the relation between $C_x$ and the moisture content $Md$ of sand, taking the NaCl percentage as a parameter;

FIG. 16 is a graph showing the relation between $C_x$ and the moisture content $M_d$, with $R_x$ being taken as a parameter; and FIG. 17 is a graph showing the relation between the output for the capacitance and resistance variation with the time elapsed after applying medicine to a palm.

First of all, the principle of the measuring method of this invention will be explained.

Figure 1A:
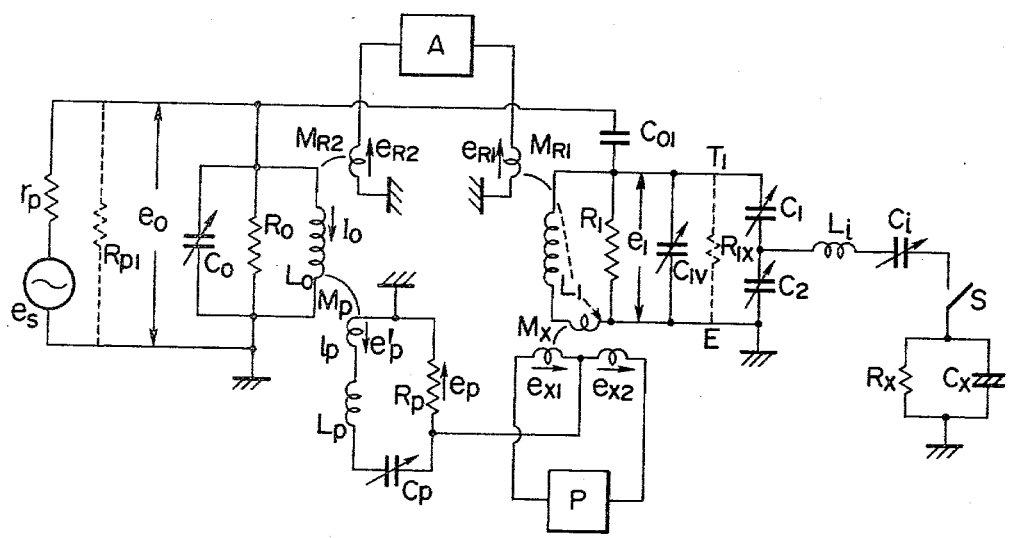
FIG. 1(A) is a circuit diagram showing an embodiment of the measuring circuit according to the method of this invention.

FIG. 1(A) and (B) illustrate the electronic circuits for carrying out the method of this invention for accurately of measuring capacitance unaffected by the value of parallel resistance, and at the same time measuring the resistance itself at high frequencies. FIG. 1(A) shows the electrostatically coupled parallel resonant type circuit and FIG. 1(B) the electromagnetically coupled series resonant type circuit.

As for FIG. 1(A), $e_s, r_p$ and $L_o-C_o$ show a high frequency source, the internal resistance of the oscillator and a tank circuit, respectively. The resonant circuit $L_1-C_{1v}$ is coupled statically by a small capacitance $C_{01}$ with the tank circuit. The series circuit $C_1-C_2$ is connected in parallel with $C_{1v}$, and, through $L_i-C_i$ and contact electrodes, specimens to be measured are connected in parallel with $C_2$. Embodiments of the contact electrodes are shown in FIG. 12 and FIG. 16. Circuits A and P are amplitude and phase sensitive detectors for measuring loss resistances and capacitances of the low impedance specimens respectively. The circuit A is an amplitude detector to detect and indicate the amplitude of the current from the parallel resonant circuit. This amplitude detector A has two input terminals, one of which is coupled with an inductance $L_o$ of the tank circuit of a high frequency source at a mutual inductance $MR_2$. The other input terminal is connected to an inductance $L_1$ of the parallel resonant circuit at a mutual inductance $MR_1$. An example of the amplitude detector is shown in FIG. 2(A). Two FET gates form the respective input terminals and the respective source electrodes of the FET's are connected with the parallel circuit of a resistor and a capacitor, respectively. This parallel circuit is to smooth the source voltage. Each source of the FET is connected to the inputs of an operational amplifier, whose output current is indicated by the conventional indicating instrument such as shown in FIG. 2(A). This indication corresponds to the current flowing through the inductance $L_1$ of the parallel resonant circuit, which is used for detecting the loss resistance of the specimen.

The phase detector circuit P is also connected with the high frequency source and the parallel resonant circuit. An example of this phase detector P is the same as shown in FIG. 2(A).

FIG. 2(B) is an eqivalent circuit which represents the high frequency source and the parallel resonant circuit. In this figure, $e_o$ is the voltage of the high frequency source, and $C_{01}$ is a coupling capacitance. L is the total equivalent inductance of the parallel resonant circuit; R is its total equivalent resistance and C is its total equivalent capacitance. In FIG. 2(B) when the circuit satisfies the condition $\omega^2 L(C_{01}+C)=1$, the left figure is equivalent to the right one, and e leads $e_o$ by 90°. There exists an $1_p-L_p-C_p-R_p$ circuit in FIG. 1(A) in order to make $e_p$ be exactly at right angles to $ex_1$ and $ex_2$, when the circuit satisfies the above condition $\omega^2 L(C_{01}+C_1)=1$, in case the $ex_1$ and $ex_2$ are the induced voltage by the mutual inductance $M_x$ from the parallel resonant circuit. Accordingly, the phase angle between the voltage $ex_1$, $ex_2$ and $e_p$ is 90° on the above condition $\omega^2 L(C_{01}+C)=1$. A vector diagram is shown in FIG. 2(C). In this figure, it will be understood that if $ex_1$ and $ex_2$ are equal with each other and are at right angles with $e_p$, $ev_1 = ev_2$. If this is so, the output of the phase detector is zero.

In the above-mentioned circuit, detection of an unknown impedance is made by at first controlling the parallel resonant circuit before connecting the unknown impedance, so as to form the resonant condition. Such resonant condition is formed when the indication by the amplitude detector is the maximum and the phase detector indicates zero.

In order to detect the capacitance of the unknown impedance, influence by the inductance of a lead wire must at first be removed, which is made by connecting the lowest possible resistor between electrodes for controlling a capacitance $C_i$. Then the electrodes are connected with the unknown impedance in order to control a condenser $C_2$, so as to form a resonant condition of the parallel resonant circuit. This condition may also be detected by the phase detector. With the change $\Delta C_2$ of the condenser $C_2$ to form the resonant condition, the capacitance of the unknown impedance may be detected. The resistance of the unknown impedance may be obtained through the indication of the amplitude detector.

FIG. 2(D) is a vector diagram of the input voltage of the amplitude detector, which will be explained later.

Figure 3:
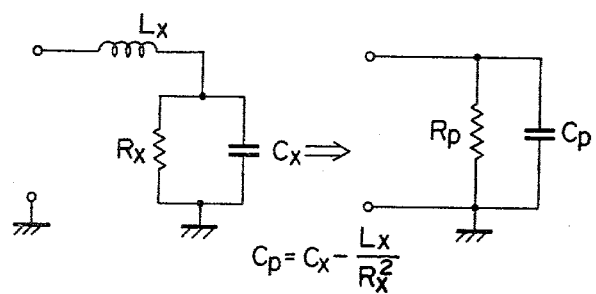
FIG. 3 is a connecting diagram showing a leadwire and a specimen.

Now, an explanation will be given of the effect of an inductance $L_x$, which is the small inductance of the lead-wire connecting the capacitance measuring part and specimen ($R_x-C_x$). In FIG. 3 it is shown that the equivalent capacitance decreases apparently when connected with the low impedance specimen ($Q_x = \omega C_x R_x < B$). The equivalent parallel capacitance $C_p$ is given by $$C_p = \frac{C_x R_x^2 (1 - \omega^2 L_x C_x) - L_x}{R_x^2 (1 - \omega^2 L_x C_x)^2 + \omega^2 L_x^2} \approx C_x - \frac{L_x}{R_x^2} \quad (1)$$

when $\omega^2 L_x C_x < 1$ and $R^2_x > \omega^2 L^2_x$.

Equation (1) shows that $C_p$ decreases as the value of the resistance $R_x$ decreases, and the second term is inversely proportional to $R_x^2$. Therefore, the measured value of the capacitance $C_x$ of the low impedance specimen is affected by the value of $R_x$ as long as the inductance $L_x$ exists.

The principle of measuring $C_x$ unaffected by $R_x$ is now explained with reference to FIG. 4. FIG. 4(A) is converted into FIG. 4(B), where $$L_p = L_x(1 + \frac{R_x^2}{\omega^2 L_x^2}), \quad R_p = R_x(1 + \frac{\omega^2 L_x^2}{R_x^2}) \quad (2)$$

Furthermore, FIG. 4(B) is converted into FIG. 4(C), where $$r_s = \frac{R_p}{1 + \frac{R_p^2}{\omega^2 L_p^2} \cdot (\omega^2 L_p C_2 - 1)^2} \quad (3)$$

$$C_s = C_2 \left\{ 1 - \frac{1}{\omega^2 L_p C_2} + \frac{1}{\omega^2 C^2 R_p^2 (\frac{\omega^2 L_p C_2 - 1}{\omega^2 L_p C_2})} \right\}$$

From equation (2) and (3) one obtains $$C_s = C_2 \left[ 1 - \frac{1}{\omega^2 L_x C_2 (1 + \frac{R_x^2}{\omega^2 L_x^2})} + \right. \quad (4)$$

-continued $$\frac{1}{\omega^2 L_x C_2 x \frac{\omega^2 L_x^2}{R_x^2} (1 + \frac{R_x^2}{\omega^2 L_x^2})\{\omega^2 L_x C_2 (1 + \frac{R_x^2}{\omega^2 L_x^2}) - 1\}}$$

If the relation $\omega^2 L_x C_2 = 1$ exists between $L_x$, $C_2$ and frequency f ($\omega = 2\pi f$), one obtains the equation (5).

$$C_s = C_2 \left\{ 1 - \frac{1}{1 + \frac{R_x^2}{\omega^2 L_x^2}} + \frac{1}{1 + \frac{R_x^2}{\omega^2 L_x^2}} \right\} = C_2 \quad (5)$$

With a similar procedure, the following relation is obtained:

$$r_s = \frac{R_x}{\omega^2 C_2^2 R_x^2} \quad (6)$$

It can be seen clearly from (5) that $C_s$ is exactly equal to $C_2$ when the relation $\omega^2 L_x C_2 = 1$ is satisfied and this is the basic principle of measuring precisely the capacitance $C_x$ regardless of the value of $R_x$.

The effect of $L_x$ with the specimen ($R_x$-$C_x$) in the circuit will be explained with reference to FIG. 5.

When the specimen ($R_x$-$C_x$) is connected in place of $R_x$ as shown in FIG. 5(A), the effect of $L_x$ is as follows: From FIG. 5(A) and FIG. 5(B), one obtains the following relations.

$$L_{px} = L_x \left\{ 1 + \frac{R_x^2}{\omega^2 L_x^2} (1 - \omega^2 L_x C_x)^2 \right\} \quad (7)$$

$$R_{px} = R_x \left\{ (1 - \omega^2 L_x C_x)^2 + \frac{\omega^2 L_x^2}{R_x^2} \right\}$$

$$C_{px} = \frac{C_x \cdot \omega^2 C_2^2 R_x^2 (1 - \omega^2 L_x C_x)^2}{1 + \omega^2 C_2^2 R_x^2 (1 - \omega^2 L_x C_x)^2}$$

Substituting $L_{px}$, $R_{px}$ and the condition of $\omega^2 L_x C_2 = 1$ into the equation (3), $C_s$ is obtained as $$C_s = C_2 + \frac{2C_x}{1 + \omega^2 C_2^2 R_x^2 (1 - \omega^2 L_x C_x)^2} \quad (8)$$

Since $C_2 > C_x$, $C_2 > 100 \cdot C_x$, $\omega \cdot C_2 R_x > 1$, and $\omega^2 L_x C_x = \omega^2 L_x C_2 \times C_x/C_2 < 0.01$ one obtains $C_s \approx C_2$, and also in this case the measured capacitance value is not affected by the value of $R_x$. $r_s$ is expressed as follows:

$$r_s = \frac{R_x \times \frac{\omega^2 L_x^2}{R_x^2} \{1 + \frac{R_x^2}{\omega^2 L_x^2} \cdot (1 - \omega^2 L_x C_x)^2\}}{1 + \frac{R_x^2}{\omega^2 L_x^2} (1 - \omega^2 L_x C_x)^4} \approx$$

-continued $$R_x \times \frac{\omega^2 L_x^2}{R_x^2} = \frac{1}{\omega^2 C_x^2 R_x}$$

The apparent increase of capacitance $\Delta C_2$ due to the specimen is expressed as $$\Delta C_2 = C_s - C_2 = \frac{2C_x}{1 + \omega^2 C_2^2 R_x^2 (1 - \omega^2 L_x C_x)^2}$$

Since the increase of capacitance due to the specimen is $C_{px}$ expressed in (7), the total increase of capacitance across $C_2$ is shown as $$C_{2m} = \Delta C_2 + C_{px} = \frac{2C_x}{1 + \omega^2 C_2^2 R_x^2 (1 - \omega^2 L_x C_x)^2}$$

$$+ \frac{C_x \cdot \omega^2 C_2^2 R_x^2 (1 - \omega^2 L_x C_x)}{1 + \omega^2 C_2^2 R_x^2 (1 - \omega^2 L_x C_x)^2}$$

$$= \frac{2 + \omega^2 C_2^2 R_x^2 (1 - \omega^2 L_x C_x)}{1 + \omega^2 C_2^2 R_x^2 (1 - \omega^2 L_x C_x)^2} \times C_x$$

Accordingly an error $\epsilon$ is given by $$\epsilon = \frac{C_{2m} - C_x}{C_x} = \frac{1 + \omega^2 C_2^2 R_x^2 \times C_x/C_2 (1 - C_x/C_2)}{1 + \omega^2 C_2^2 R_x^2 (1 - C_x/C_2)^2}$$

$$\approx \frac{1}{1 + \omega^2 C_2^2 R_x^2 (1 - C_x/C_2)^2} + \frac{C_x}{C_2} (1 + C_x/C_2)$$

where $\omega^2 C_2^2 R_x^2 \gg 1$. If $C_x/C_2 < 0.01$ the approximate degree of the error is determined by the value of $\omega^2 C_2^2 R_x^2$. To measure the capacitance $C_x$ within several percent of error, it is required that the value of $\omega C_2 R_x$ is not less than 4. Accordingly, the value of $C_2$ can be settled for the minimum value of $R_x$ expected at the measuring frequency f. If the condition $\omega 2 L_x C_2 = 1$ is satisfied in FIG. 4, one obtains (5) and then the relation $C_s = C_2$ is satisfied. Referring to the relation between $C_s$ and $C_2$, when small inductance change $\pm \Delta L_x$ is given in $L_x$ $$\omega^2 (L_x \pm \Delta L_x) C_2 = \omega^2 L_x C_2 \pm \omega^2 \Delta L_x C_2 = 1 \pm \frac{\Delta L_x}{L_x} \quad (9)$$

$L_p$ and $R_p$, shown in FIG. 4(B), is expressed as follows, respectively:

$$L_p = (L_x \pm \Delta L_x) \left\{ 1 + \frac{R_x^2}{\omega^2 (L_x \pm \Delta L_x)^2} \right\},$$

$$R_p = R_x \left\{ 1 + \frac{\omega^2 (L_x \pm \Delta L_x)^2}{R_x^2} \right\}$$

Substituting these equations into (5), one obtains the following equation:

$$C_s = C_2 \left[ 1 - \frac{1}{(1 \pm \frac{\Delta L_x}{L_x})\{1 + \frac{R_x^2}{\omega^2 (L_x \pm \Delta L_x)^2}\}} \right.$$

$$+ \frac{1}{(1 \pm \frac{\Delta L_x}{L_x})\{1 + \frac{\omega^2(L_x \pm \Delta L_x)^2}{R_x^2}\}} \left[ \frac{R_x^2}{\omega^2(L_x \pm \Delta L_x)^2} \pm \frac{\Delta L_x}{L_x} \{1 + \frac{R_x^2}{\omega^2(L_x \pm \Delta L_x)^2}\} \right]$$

When $\Delta L_x/L_x$ is negligible compared to an unity, $$C_s = C_2 \left\{ 1 - \frac{1 \mp \frac{\Delta L_x}{L_x}}{1 + \frac{R_x^2}{\omega^2(L_x \pm \Delta L_x)^2}} + \frac{1}{(1 \pm \frac{L_x}{L_x})^2 \{1 + \frac{R_x^2}{\omega^2(L_x \pm \Delta L_x)^2}\}} \times \frac{1}{1 \pm \frac{\Delta L_x}{L_x} \cdot \frac{1 \pm \Delta L_x/L_x}{\omega^2 C_2^2 R_x^2}} \right\} \tag{10}$$

When $\Delta L_x/L_x << 1$ and $\omega^2 C_2^2 R^2 >> 1$, (for example, $f=3\times 10^6$ $C_2=3000$ pF, $R_x=100$ Q, one obtains $\omega^2 C_2^2 R^2 = 32$) equation (10) is rewritten as follows:

$$C_s = C_2 \left\{ 1 - \frac{1 \mp \frac{\Delta L_x}{L_x}}{1 + \frac{R_x^2}{\omega^2(L_x \pm \Delta L_x)^2}} + \frac{1 \mp 2 \cdot \frac{\Delta L_x}{L_x}}{1 + \frac{R_x^2}{\omega^2(L_x \pm \Delta L_x)^2}} \right\} \tag{11}$$

$$= C_2 \left\{ 1 \mp \frac{\Delta L_x}{L_x} \cdot \frac{1}{1 + \frac{\omega^2 C_2^2 R_x^2}{(1 \pm \Delta L_x/L_x)}} \right\}$$

That is to say, under the condition of $\omega^2 L_x C_2 = 1$, $C_s$ becomes equal to $C_2$, so that the capacitance measuring circuit is not affected by $R_x$, and it is obvious from (11) that when the inductance change $\pm\Delta L_x$ occurs in $L_x$, $C_s$ decreases from $C_2$ due to $+\Delta L_x$ and the output meter shows a minus deflection by $R_x$, and likewise $C_2$ increases from $C_2$ due to $-\Delta L_x$ and the output meter shows a plus deflection by $R_x$. This phenomenon can not be remarkably seen in the range of high resistance value of $R_x$. Accordingly the adjustment of deciding the adequate value of $L_x$ may be made by use of the low resistance, for example, 50–100 ohms. As explained before, the condition of $\omega^2 L_x C_2 = 1$ being satisfied, the precise measurement of capacitance is performed regardless of the value of $R_x$. In practice, the measuring part and detecting electrode are connected with a HF coaxial cable of several meters. Let the inductance of the cable be Li, $\omega^2 L_i C_2$ is larger than unity. Therefore the variable capacitor $C_i$ is inserted in series between the top of the cable and the electrode as shown in FIG. 5(D) and adjusts the value of $C_i$ to satisfy the condition of $\omega^2 L_x C_2 = 1$, when $L_x = L_i - 1/\omega^2 C_i$.

Measurement of the capacitance by the electrostatically coupled parallel resonant type circuit shown in FIG. 1(A).

In FIG. 1(A), will be further explained, the resistance $R_{1x}$ which is inserted between $T_1$ and E due to $R_x$ is shown as $$R_{1x} = (1 + \frac{C_2}{C_1})^2 \cdot R_x \tag{12}$$

when $\omega C_2^2 R_x^2 >> 1$. Suppose that $R_{1r}$ is the combination of resistance $R_1$ with $R_{1x}$. Then $$R_{1r} = \frac{R_1 \cdot R_x(1 + C_2/C_1)^2}{R_1 + (1 + C_2/C_1)^2 \cdot R_x} \tag{13}$$

Under the condition of $\omega^2 L_1\{C_{01}+C_{1\nu}+C_1 \cdot C_2/(C_1+C_2)\}=1$, the following relations are obtained since Rp1 is equal to $1/\omega^2 C_{01} R_{1r}$:

$$e_o = e_s \times \frac{1}{1 + r_p/R_{p1}} = \frac{R_1 + R_x(1 + C_2/C_1)^2}{R_1 + R_x(1 + C_2/C_1)^2 \cdot (1 + \omega^2 C_{01}^2 R_1 r_p)} \cdot e_s$$

$$e_p = \frac{M_p}{L_o} \cdot e_o = \frac{M_p}{L_o} \cdot \frac{R_1 + R_x(1 + C_2/C_1)^2}{R_1 + R_x(1 + \omega^2 C_{01}^2 R_1 r_p)(1 + C_2/C_1)^2} \cdot e_s$$

$$|e_1| = \omega C_{01} R_1 r e_o = \frac{\omega C_{01} R_1 R_x(1 + C_2/C_1)^2}{R_1 + R_x(1 + \omega^2 C_{01}^2 R_1 r_p)(1 + C_2/C_1)^2} \cdot e_s$$

$$e_x = \frac{M_x}{L_1} |e_1| = \frac{M_x}{L_1} \cdot \frac{\omega C_{01} R_1 R_x(1 + C_2/C_1)^2}{R_1 + R_x(1 + \omega^2 C_{01}^2 R_1 r_p)(1 + C_2/C_1)^2} \cdot e_s$$

where $R_o$ is the equivalent parallel resistance of the tank circuit and $R_o >> R_{p1}$ is assumed. Suppose that $\theta$ is the phase shift of $e_x$ due to $C_x$. Then, $$\tan \theta = \omega \Delta C_1 R_{1r} = \omega \cdot \frac{C_x}{(1 + C_2/C_1)^2} \cdot \frac{R_1 R_x(1 + C_2/C_1)^2}{R_1 + R_x(1 + C_2/C_1)^2} = \frac{\omega C_x R_x R_1}{R_1 + R_x(1 + C_2/C_1)^2}$$

The output $I_{gc}$ of the phase sensitive detector induced by $C_x$ is shown by $$I_{gc} = 4K e_p e_x \tan \theta = 4K \cdot \frac{M_p M_x}{L_o L_1} \cdot \frac{\omega C_{01} R_1^2 R_x(1 + C_2/C_1)^2 \cdot \omega C_x R_x \cdot e_s^2}{\{R_1 + R_x(1 + \omega^2 C_{01}^2 R_1 r_p)(1 + C_2/C_1)^2\}^2} \tag{14}$$

where K is the detector constant. In the derivation of (14), the square law characteristic of the detector was assumed.

As for the sensitivity of the capacitance measurement, the following explanation is being made:

Putting $X = (1 + C_2/C_1)$ and $\partial I_{gc}/\partial X = 0$, one obtains $$R_1 = R_x(1 + \omega^2 C_{01}^2 R_1 r_p)(1 + C_2/C_1)^2 \qquad (15)$$

From (14) and (15), the output $I_{gc}$ can be rewritten as $$I_{gc} \equiv I_{gc2} = 4K \cdot \frac{M_p M_x}{L_o L_1} \cdot \tfrac{1}{2} \cdot \frac{\omega C_{01} R_1 \cdot \omega C_x R_x}{1 + \omega^2 C_{01}^2 R_1 r_p} \cdot e_s \qquad (16)$$

When $C_{01}$ is adjusted to the maximum output for a constant $C_x$, the following relation is obtained:

$$\omega^2 C_{01}^2 R_1 r_p = 1 \qquad (17)$$

From (15) and (17), one obtains $$R_x(1 + C_2/C_1)^2 = R_1/2 \qquad (18)$$

For the specimen which satisfies the equation (18), the output $I_{gc}$ of the detector P induced by a constant capacitance change $C_x$ becomes maximum, and the equation is expressed as $$I_{gc} \equiv I_{gc2} - c1 = 4K \frac{M_p M_x}{L_o L_1} \cdot \tfrac{1}{2} \cdot \sqrt{\frac{R_1}{r_p}} \cdot e_s^2 \cdot \omega C_x R_x \qquad (19)$$

Furthermore under the condition of the equation (17) and (18), the output $I_{gc}$ with the specimen ($R_x \infty$, $C_x$) in which the parallel resistance is infinity is obtained as $$I_{gc} \equiv I_{gc} R_x \infty = 4K \frac{M_p M_x}{L_o L_1} \cdot \tfrac{1}{2} \sqrt{\frac{R_1}{R_p}} \cdot e_s^2 \cdot \omega C_x R_x \qquad (20)$$

From equation (19) and (20), the following relation is given:

$$\frac{I_{gc} R_x \infty}{I_{gc2} - c1} = 4 \qquad (21)$$

The equivalent parallel resistance of the specimen can be measured as follows: Suppose $R_o \gg R_{p1}$ in FIG. 1(A), $e_o$ is expressed as $$e_o = \frac{1}{1 + r_p/R_{p1}} \cdot e_s$$

When the relation $$\omega^2 L_1 (C_{01} + C_{1\nu} + \frac{C_1 \cdot C_2}{C_1 + C_2}) = 1$$

is satisfied and with the specimen out, the following relations are obtained for the equivalent parallel resistance $R_1$ of the resonant circuit:

$$R_{p1} = \frac{1}{\omega^2 C_{01}^2 R_1} \quad e_o = \frac{e_s}{1 + r_p/R_{p1}} \quad \therefore e_o = \frac{e_s}{1 + \omega^2 C_{01}^2 R_1 r_p}$$

$$|e_1| = \omega C_{01} R_1 e_o = \frac{\omega C_{01} R_1 e_s}{1 + \omega^2 C_{01}^2 R_1 r_p}$$

Accordingly, $$e_{R1} = \frac{M_{R1}}{L_1} \cdot e_s \cdot \frac{\omega C_{01} R_1}{1 + \omega^2 C_{01}^2 R_1 r_p} \qquad (22)$$

$$e_{R2} = \frac{M_{R2}}{L_o} \cdot e_s \cdot \frac{1}{1 + \omega^2 C_{01}^2 R_1 r_p} \qquad (23)$$

The combined parallel resistance of the resonant circuit $L_1$-$C_{1\nu}$, in case that the specimen ($R_x$-$C_x$) is connected in parallel with $C_2$ through $L_i$-$C_i$ under the condition of $\omega^2(L_i - 1/\omega^2 C_i) C_2 = 1$ is given as $$R_{1r} = R_1 R_{1x}/R_1 + R_{1x}$$

where $R_{1x} = (1 + C_2/C_1)^2 \cdot R_x$.

Let R1', R2' be $e_{R1}$ and $e_{R2}$ when the specimen is in circuit and the parallel resistance is $R_{1r}$, then from (22) and (23) the following relations are obtained:

$$e'_{R1} = \frac{M_{R1}}{L_1} \cdot e_s \cdot \frac{\omega C_{01} R_{1r}}{1 + \omega^2 C_{01}^2 R_{1r} r_p} \qquad (24)$$

$$e'_{R2} = \frac{M_{R2}}{L_o} \cdot e_s \cdot \frac{1}{1 + \omega^2 C_{01}^2 R_{1r} r_p} \qquad (25)$$

As shown in FIG. 2(D), $e_{R1}$ decreases and $e_{R2}$ increases due to the specimen ($R_x$-$C_x$). When no specimen in circuit, let $e_{R1}$, $e_{R2}$ be equal to $e_R$, then output $V_{gR}$ of the loss detector indicates zero. But the small voltage change $\delta\delta e_R = e_{R2'} - e_{R1'}$ generates the voltage $V_g R = K\Delta e_R$ due to $R_x$. Since $\Delta e_{R1} = e_{R1} - e'_{R1}$ $\Delta e_{R2} = e_{R2'} - e_{R1}$ the following relation is obtained:

$$\Delta e_R = e'_{R2} - e'_{R1} = (\Delta e_{R2} + R_2) - (e_{R1} - \delta\delta E_{R1}) = \Delta e_{R1} + \Delta e_{R2}$$

From equation (22) and (24), one obtains $$\Delta e_{R1} = \frac{M_{R1}}{L_1} \cdot e_s \cdot \frac{\omega C_{01} R_1}{1 + \omega^2 C_{01}^2 R_1 r_p} - \frac{M_{R1}}{L_1} \cdot \qquad (26)$$

$$e_s \frac{\omega C_{01} R_{1r}}{1 + \omega^2 C_{01}^2 R_{1r} r_p} = e_{R1} \frac{1 - R_{1r}/R_1}{1 + \omega^2 C_{01}^2 R_{1r} r_p}$$

From (23) and (25), $$\Delta e_{R2} = \frac{M_{R2}}{L_o} \cdot e_s \frac{1}{1 + \omega^2 C_{01}^2 R_1 r_p} - \frac{M_{R2}}{L_o} \cdot \qquad (27)$$

$$e_s \cdot \frac{1}{1 + \omega^2 C_{01}^2 R_{1r} r_p} = e_{R2} \frac{\omega^2 C_{01}^2 R_1 r_p (1 - R_{1r}/R_1)}{1 + \omega^2 C_{01}^2 R_{1r} r_p}$$

Putting $e_{R1} = e_{R2} \equiv e_R$, the following relation is introduced from equation (26) and (27):

$$\Delta e_R = \Delta e_{R1} + \Delta e_{R2} = e_R \cdot \frac{1 + \omega^2 C_{01}^2 R_1 r_p}{1 + \omega^2 C_{01}^2 R_{1r} r_p} (1 - \frac{R_{1r}}{R_1}) = \qquad (28)$$

$$e_R \cdot \frac{1 + \omega^2 C_{01}^2 R_1 r_p}{1 + \omega^2 C_{01}^2 R_{1r} r_p} \cdot \frac{R_1}{R_1 + R_{1X}}$$

Suppose that the minimum resistance of the specimen is $R_{xmin}$, the substituting (17) which is the condition of the maximum capacitance sensitivity into (28), one obtains $$\Delta e_R = e_R \cdot \frac{2}{1 + \omega^2 C_{01}^2 R_1 r_p \cdot R_{1r}/R_1} \cdot \frac{R_1}{R_1 + R_{1x}} = \qquad (29)$$

$$e_R \cdot \frac{2}{1 + 2R_{1x}/R_1}$$

Now an explanation will be given on the capacitance measurement by electromagnetically coupled series resonant type circuit shown in FIG. 1(B).

Figure 1B:
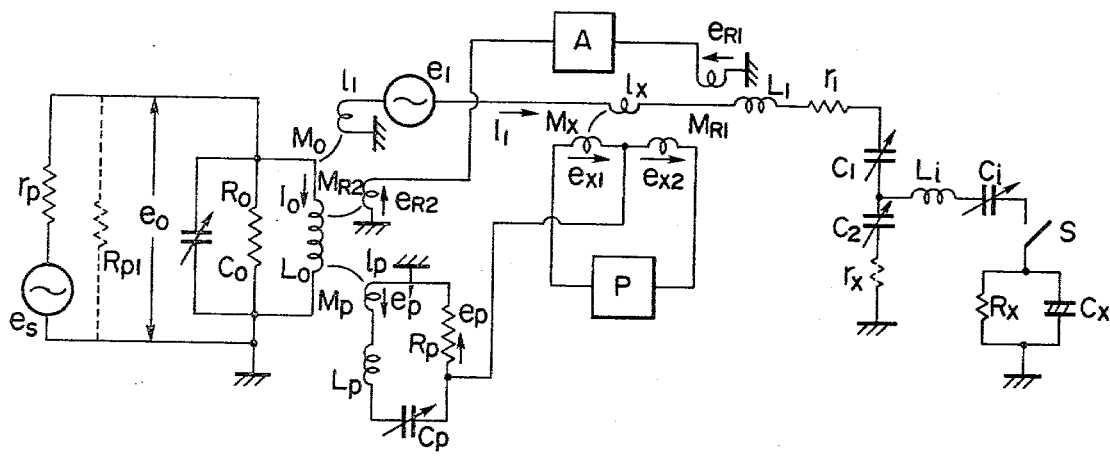
FIG. 1(B) is a circuit diagram showing another embodiment of the measuring circuit according to the method of this invention.

The above-explained principle in relation to FIG. 1(A) applies similarly to the circuit shown in FIG. 1(B). The vector diagrams shown in FIG. 2(C) and FIG. 2(D) may be applied similarly to this circuit. Therefore detailed explanation thereon will not be repeated here.

The calculated result of the output of the phase detector is given as $$I_{gc} = 4K \frac{\omega M_x M_p M_o L_o^2 e_s^2 \cdot \omega^2 C_2^2 R_x \cdot \omega C_x R_x}{\{L_o^2(1 + \omega^2 C_2^2 r_1 R_x) + M_o^2 r_p \cdot \omega^2 C_2^2 R_x\}^2} \quad (30)$$

Under the condition of $$M_o 2 r_p = L_o 2 r_1, \; 1/\omega^2 C_o 2 R_x = r_x = 2r_1 \quad (31)$$

the maximum sensitivity of the output can be obtained as follows:

$$I_{gc} \equiv I_{gc2-Mo} = 4K \cdot \frac{\omega M_x M_p e_s^2 \cdot \omega C_x R_x}{8 L_o \sqrt{r_1 r_p}} \quad (32)$$

When the value of $R_x$ is infinity, the output of the phase detector due to $C_x$ is given as $$I_{gRx\infty} = 4K \cdot \frac{\omega M_x M_p e_s^2 \cdot \omega C_x R_x}{2 L_o \sqrt{r_1 r_p}} \quad (33)$$

From (32) and (33), the following equation is obtained:

$$\frac{I_{gRx\infty}}{I_{gc2-Mo}} = 4 \quad (34)$$

It is noteworthy that the equation (34) is equal to (21). The output of the loss sensitive detector due to $R_x$ is expressed as $$\Delta e_R = e_R \cdot \frac{2}{1 + 2\omega^2 C_2^2 r_1 R_x} = e_R \cdot \frac{2}{1 + 2r_1/r_x} \quad (35)$$

The output $\Delta e_R$ is expressed in the same form for parallel and series resonant circuits.

Hereinunder the characteristics of the circuits are shown according to the test results, which are common to the both circuits of FIG. 1(A) and FIG. 1(B). FIG. 6 shows the result of experiments which deals with the adjustment of $L_x$.

A HF coaxial cable (RG-62/U 1.9 meters) was used as $L_i$ instead of a coil. The inductance of the cable is about 0.4 μH per meter and the distributed capacity $C_d$ is 40 pF per meter, and therefore $L_i$ and $C_d$ of the cable of 1.9 meters are 0.76 μH and 76 pF, respectively. One obtains $C'_2 = C_2 + C_d = 4076$ pF. As seen from FIG. 6 $C_i = 2900$ pF satisfies the condition of $\omega^2 L_x C'_2 = \omega^2(L_i - 1/\omega^2 C_i) C'_2 = 1$. Substituting $C_i = 2900$ pF and $C'_2 = 4076$ pF into the equation $\omega^2(L_i - 1/\omega^2 C_i)C'_2 = 1$, the value of $L_i$ is given as 0.77 μH and this value agrees with 0.76 μH. The influence of the resistance $r_i$ of $L_i$ upon the performance of $L_x$ is negligible when the step up ratio $Q_i = \omega L_i / r_i$ is larger than fifty or more.

FIG. 7 shows the relation between the output $I_{gc}$ and $R_x$ at 3MHz where $C_i$ is the parameter.

It is obvious from FIG. 7 that the output of the phase detector is not affected by the value of $R_7$ under the condition of $\omega^2 L_x C_2 = \omega^2(C_2 = 1$. FIG. 8 shows the relationship between the output and $C_2$ when this circuit operates as a capacitance meter for measuring the very low impedance specimens, where the minimum equivalent parallel resistance $R_{xmin}$ is expected to be 100 ohms. Under the condition of the maximum sensitivity, $a = I_{gR X\infty}/I_{gR\times 100}$ becomes 4, which is in accord with the equation (21). FIG. 9 shows the operating characteristics of the instrument as a zero method capacitance meter when $C_2$ is adjusted to the maximum sensitivity for 100 ohms and the value of $C_x$ is constant. Table 2 illustrates the measured value of $C_x$ (39 pF and 49.1 pF) by the zero method when $R_x$ varies from infinity to 30 ohms.

Table 2

| | Parallel resonant type circuit | | $f = 4.4 \times 10^6$ specimen: 39PF | |
| --- | --- | --- | --- | --- |
| $R_x$ ohm | $C'_2$ dial degree | $C'_{2x}$ dial degree | $C_x = k_1(C'_2 - C'_{2x})$ PF | Error % |
| ∞ | 80 | 38 | 39 | 0 |
| 5kΩ | 80 | 38 | 39 | 0 |
| 1k | 80 | 38 | 39 | 0 |
| 500 | 80 | 38 | 39 | 0 |
| 300 | 80 | 38 | 39 | 0 |
| 200 | 80 | 38 | 39 | 0 |
| 100 | 80 | 38 | 39 | 0 |
| 50 | 80 | 37.5 | 39 | 1.3 |
| 30 | 80 | 36 | 40.9 | 4.9 |
| | Series resonant type circuit | | $f = 3 \times 10^6$ specimen: 49.1PF | |
| $R_x$ ohm | $C'_2$ dial degree | $C'_{2x}$ dial degree | $C_x = k_2(C'_2 - C'_{2x})$ pF | Error % |
| 1kΩ | 80 | 28.7 | 49.2 | 0.2 |
| 500 | 80 | 28.7 | 49.2 | 0.2 |
| 200 | 80 | 28.8 | 49.15 | 0.1 |
| 100 | 80 | 28.2 | 49.7 | 1.2 |
| 50 | 80 | 27 | 50.9 | 3.6 |

$k_1$, $k_2$: coefficient of standard capacitor
$C'_2$: standard variable capacitor connected in parallel with $C_2$ It is obvious from the table that the error is of the order of 3-4% for minimum value of $R_x$ and decreases as $R_x$ becomes higher. For the resistance $R_x$ and capacitance $C_x$, carbon film resistor and polystyrene capacitor were used. From the equation (14) it can be known that the output $I_{gc}$ has a tendency not to be affected by the value of $R_x$ according as the value of $C_{01}$ or $C_2/C_1$ is made larger. FIG. 10 shows the relation between the outputs $I_{gc}$ and $R_x$ when the values of $C_{01}$ and $C_2/C_1$ are made larger than the value adjusted to the maximum sensitivity and in the equation (14) the condition $R_x(1+\omega^2 C_{01} R_1 r_p)(1+C_2/C_1)^2 > R_1$ is satisfied, for the purpose of using this circuit as a direct reading capacitance meter. It may be said that as a direct reading capacitance meter this circuit is capable of measuring the capacitances of very high loss specimens within several percent of error. FIG. 11 shows the relation between the output and $C_x$ when the circuit operates as a direct reading capacitance meter. From FIG. 11 it can be seen that the linearity is held in all the measuring range. FIG. 12 represents the relation between the output of the loss sensitive detector and $R_x$, and in this figure the full line shows the experimental result and dotted curve shows the calculated result from the equation (35). They are in complete agreement with each other.

FIG. 13 shows the relation between the capacitances of the three kinds of electrolytic solution and their equivalent parallel resistance $R_x$ when the concentration was varied. A concentrical-cylindrical capacitor was used as a measuring electrode, and FIG. 14 shows the relationship between the resistivity of the electrolytic solution $\rho_x$ and its parallel resistance $R_x$. Similar experiments using the parallel plate electrode and two of others also showed the same characteristics that a dielectric constant increased as the concentration of the solution increased, and $R_x$ decreased. There have been various kinds of measured dielectric property of electrolytic solution, but their experimental results were different from one another. Though a recent experiment stated that the dielectric constant of the electrolytic solution decreased as the concentration of electrolyte increased, it is for the reason that capacitances of specimens apparently decreased due to small inductance of the lead-wire connecting the electrode and measuring instrument. FIG. 15 shows the relation between the moisture content and capacitance of sand involving salt. As is obvious from FIG. 15, when the electrolyte involved in sand increases and the parallel resistance varies, it is difficult to read the moisture content from measured capacitance $C_x$ because sand of the same moisture content shows the different capacitance. Since this measuring instrument can measure $C_x$ and $R_x$ at the same time, the moisture content of specimen containing electrolyte, which has been difficult to measure with the conventional techniques, can be measured with a calibrated curves as $R_x$ is parameter. The related curve shown in FIG. 16 is obtained from FIG. 15. The following Table 3 shows the relation between capacitance and resistance of one's palm (the ball of one's thumb).

Table 3

| sex | | age | $V_R$ (mV) | $R_x$ (ohm) | $C_x$ (PF) | weight (kg) |
|---|---|---|---|---|---|---|
| man | A | 19 | 428 | 660 | 47.9 | 66 |
| | B | 29 | 738 | 380 | 47.2 | 80 |
| | C | 30 | 1028 | 270 | 65.8 | 45' |
| | D | 37 | 692 | 410 | 54.5 | 57 |
| | E | 59 | 493 | 580 | 41.2 | 68 |
| | F | 70 | 120 | 2300 | 29.3 | 48 |
| woman | A* | 6 | 376 | 760 | 47.9 | 20 |
| | B | 9 | 936 | 300 | 64.6 | 22 |
| | C | 9 | 862 | 320 | 66.2 | 23 |
| | D | 16 | 851 | 325 | 51.9 | 56 |
| | E | 16 | 838 | 335 | 55.6 | 46 |
| | F | 16 | 496 | 570 | 45.2 | 49 |
| | G | 18 | 431 | 660 | 46.8 | 53 |
| | H | 18 | 845 | 330 | 55.5 | 60 |
| | I | 29 | 514 | 550 | 42.6 | 51 |
| | J | 37 | 789 | 355 | 50.8 | 58 |

*suffers from eczema

In general, it may be said that the younger one is, the larger the capacitance and the smaller the resistance becomes. Man-F whose measured values are much different from others is suffering from a skin disease. FIG. 17 shows the relation between the time passed from applying medicine for the skin disease to his palm and the capacitance, resistance of his palm. Marks ⓞ,⦿,⊗ and Ⓐ are the measured values before the medicine is applied to one's palm. From magnitude of A and A', it may be seen that the palm of the man-F had been very dry before the medicine was applied to his palm, and from the curves shown in FIG. 17 it may be seen how long the efficacy of medicine continues. These three applied examples even show the characteristics of this measuring circuit that it can measure the dielectric property which have been difficult to measure by the conventional methods.

These circuits are very simple as above, but the capability of measuring very low impedance at high frequencies is superior to all other circuits known hitherto. At present, for the precise measurement of $C_x$, the lower limit of $R_x$ is about 30 ohms but it can be expected in the near future to extend the measuring range of $C_x$ and $R_x$ furthermore. A lead-wire inductance being effectively used, the circuit has the advantage of using several meter's HF coaxial cable between the measuring instrument and the electrode. Therefore this measuring instrument may find a wide range of applications, of course in industrial, agricultual and medical fields, and also in research of physic such as dielectric analysis of liquid and dielectric property of semiconducting materials. Besides the measurement of $C_x$ and $R_x$, it is possible to measure $\Delta R_x$, $\Delta C_x$ of very low impedance utilizing the same principle as for $C_x$ and $R_x$, and also various fields of applications are expected.

It will be understood that further variations and modifications can be effected within the spirit and scope of the invention.

What is claimed is:

1. In a method of measuring a low impedance for obtaining an unknown capacitance and/or resistance of the type wherein: forming a low impedance measuring circuit with (a) a resonant circuit including capacitances $C_1$ and $C_2$ connected in series with each other, (b) a high frequency source to supply the resonant circuit with a high frequency voltage, (c) an amplitude detecting circuit respectively coupled electromagnetically with the high frequency source and the resonant circuit for measuring the resonant current of the resonant circuit, (d) a phase detecting circuit respectively coupled electromagnetically with the high frequency source and the resonant circuit for measuring the phase of the resonant current of the resonant circuit, and (e) means for connecting the connecting point between the capacitances $C_2$ and $C_1$ of the resonant circuit with electrodes to be connected with the impedance to be measured so as to connect the impedance to be measured with the condenser $C_2$ in parallel;

adjusting the resonant circuit to the resonant condition before connecting the impedance to be measured;

connecting then the impedance to be measured and adjusting the capacitance $C_2$ of the resonant circuit to form again the resonant condition; and obtaining the unknown capacitance of the impedance to be measured from the extent of the adjustment of the capacitance $C_2$ and the unknown resistance from the indication of the amplitude detector; the improvement comprising:

forming the means for connecting with an inductance $L_x$ so as to satisfy the equation $\omega^2 C_2 L_x = 1$ where $\omega$ is the angular frequency of the high frequency source.

2. A method of measuring a low impedance for obtaining an unknown capacitance and/or resistance according to claim 1, wherein the inductance $L_x$ comprises the series circuit of an inductance $L_i$ and a capacitance $C_i$ so that the equation $\omega^2 C_2(L_i - 1/\omega^2 C_i) = 1$ is satisfied.

3. A method of measuring a low impedance for obtaining an unknown capacitance and/or resistance according to claim 2, wherein the connecting means is a series circuit of a coaxial cable and a variable capacitor.

4. A method of measuring a low impedance for obtaining an unknown capacitance and/or resistance according to claim 1, wherein the resonant circuit is a parallel resonant circuit coupled electrostatically with the high frequency source.

5. A method of measuring a low impedance for obtaining an unknown capacitance and/or resistance according to claim 1, wherein the resonant circuit is a series resonant circuit electromagnetically coupled with the high frequency source.

* * * * *